(12) United States Patent
Binnig et al.

(10) Patent No.: US 6,218,086 B1
(45) Date of Patent: Apr. 17, 2001

(54) METHOD OF FORMING ULTRASMALL STRUCTURES AND APPARATUS THEREFOR

(75) Inventors: Gerd K. Binnig, Wollerau; Michel Despont, Adliswil; Walter Haeberle, Waedenswil; Peter Vettiger, Langnau, all of (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/147,865

(22) PCT Filed: Jul. 17, 1997

(86) PCT No.: PCT/IB97/00894
  § 371 Date: Mar. 17, 1999
  § 102(e) Date: Mar. 17, 1999

(51) Int. Cl.$^7$ ........................................ G03F 7/00
(52) U.S. Cl. ........................ 430/330; 216/52; 369/43
(58) Field of Search .................. 430/33; 216/52; 369/43

(56) References Cited

U.S. PATENT DOCUMENTS

| | | | |
|---|---|---|---|
| 4,731,155 | * 3/1988 | Napoli | 156/643 |
| 5,252,835 | * 10/1993 | Lieber | 250/492.1 |
| 5,461,600 | * 10/1995 | Pohl | 369/44.38 |
| 5,537,372 | * 7/1996 | Albrecht | 369/43 |
| 6,084,849 | * 7/2000 | Durig | 369/126 |

FOREIGN PATENT DOCUMENTS 8-297870 * 11/1996 (JP).

OTHER PUBLICATIONS

Shinichi, "Micromachining Method", Patent Abstracts of Japan 8–083789, Mar. 1996.*
Goto, "Micromachining with a force microscopic tip assisted by electrostatic force", Rev. Sci. Instrum. 67 (2), pp. 397–400, Feb. 1996.*
Majumdar, "Nanometer–scale lithography using the atomic force microscope", Appl. Phy. Lett. 61 (19), pp. 2293–2295, Nov. 1992.*

\* cited by examiner

*Primary Examiner*—Mark F. Huff
*Assistant Examiner*—Nicole Barreca
(74) *Attorney, Agent, or Firm*—Ronald L. Drumheller

(57) ABSTRACT

The present invention discloses a method of forming ultrasmall (nano) structures in a thin film provided on a substrate by means of a tip which is movable relative to the surface of the thin film. According to principles of the invention, the penetration depth of the tip is limited, thereby avoiding wear of the tip. Furthermore, an apparatus for carrying out the method is disclosed.

15 Claims, 3 Drawing Sheets

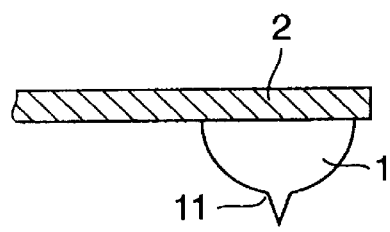
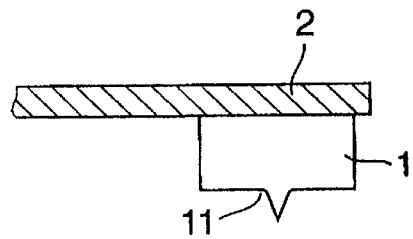
Fig. 3a  Fig. 3b
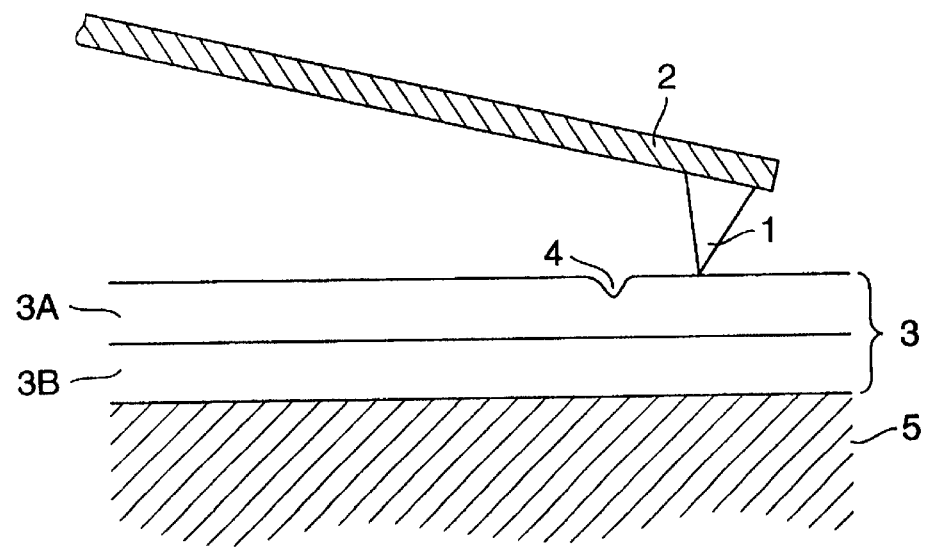
Fig. 4

METHOD OF FORMING ULTRASMALL STRUCTURES AND APPARATUS THEREFOR

TECHNICAL FIELD

The invention relates to a method of forming ultrasmall structures which have dimensions in the order of nanometers in a thin film; the invention is particularly applicable to nano-lithography production methods, in which a thin polymer layer is used. Preferably, these structures are formed by means of devices the basic construction of which is similiar to that of an atomic force microscope (AFM). Furthermore, the invention relates to an apparatus for carrying out the method.

BACKGROUND OF THE INVENTION

In the prior art, there are known several methods for forming structures that are of very small dimension (nanostructures); many methods of this kind make use of AFM-like devices, i.e. devices which mainly consist of a tip which is mounted on a cantilever, the latter being relatively movable with respect to a substrate. Particularly, nano-lithography by AFM has a high potential due to the ability of this technology to create structures in the order of nanometers, which dimension is even smaller than the wavelength of conventional laser light.

However, a problem that usually occurs in these known methods is the wear of the tip of the AFM; this is because the nanostructures are formed by applying current to the tip in order to modify the structure of a photoresist layer, this current destroying the apex of the tip after relatively short time. A further disadvantage of these conventional methods has to be seen in that the writing into a layer of polymer by an AFM device does not give satisfactory results with respect to the resulting pit size.

Furtheron, in most of these prior-art devices, the application of force writing has been used in order to form the structures. However, the process speed is relatively slow in this approach because the relatively soft cantilevers of the AFM devices have to be deformed to a large extent in order to obtain a force of sufficient strength. Thus, the formation of the nanolithographic structures takes a very long time.

Accordingly, it is the object of the present invention to provide a method of forming ultrasmall structures, i.e. structures having dimensions in the order of nanometers, which both allows to form extremly small pit sizes and to avoid wear of the tip. When in the following it is referred to avoidance of tip wear, also a reduced tip wear with respect to known methods shall be implied.

SUMMARY OF THE INVENTION

This object is solved by the characterizing features of the claims. Advantageous further developments of the invention are subject-matter of the subclaims.

The basic idea of the present invention which is linking the subject-matter of the afore-mentioned independent claims is a measure to provide a limitation of the penetration depth of the tip, the limited penetration depth being selected such that the apex (distal end) of the tip is hindered from touching the comparatively hard surface of the substrate. The tip, therefore, is only contacting the film, the hardness of which, usually, is much smaller than the hardness of the tip; thus, even after a long process time, the tip will not show any wear at all.

Acordiling to the first embidoment, the present invention proposes a method for forming ultrrasmall structures which is characterized by the usage of a thin film which is formed in a thickness which is in the same order as the smallest dimension of the ultrasmall structures to be formed therein. That is to say, the structures formed in the thin film are substantially of a similar size as the thickness of the film. Experiments made by applicants have proven that that such a thin layer effectively avoids wear of the tip, if the structures or pits (recesses) are formed by means of a tip which is heated to a temperature which is sufficient to locally deform the thin film below the tip, i.e. by means of a thermal treatment of the thin layer; the thin layer, due to its small thickness, is effectively cooled by the underlying substrate which, normally, has a much higher heat conductance than the thin layer; hence, the heat deformation of the thin layer is stopped before the apex of the tip may contact the substrate and the tip does not show wear because the thin layer is much softer than the tip.

The tip used in the afore-mentioned method preferably is provided with an integral heater which is able to heat substantially the tip only; the surrounding portions of the cantilever, however, should be heated as little as possible, i.e. these parts should be isolated with respect to the tip. An integrally heated tip of that type has the advantage of a very fast process speed; furthermore, the reduced energy consumption of such a tip allows the usage of a plurality of tips in parallel so that the processing speed can be dramatically increased. This is an important aspect if very complex lithographic structures have to been formed in a reasonably short time.

According to the second embodiment, another approach of the present invention to solve the afore-mentioned problem is the use of a tip which, near the distal end thereof, is broadening so as to form a step which is limiting the penetration depth of the tip into the thin film. By suitably selecting the dimensions of this step it is possible to limit the penetration depth of the apex of the tip; i.e., normally, the tip will penetrate into the thin film up to that depth only at which the step is contacting the surface of the film, thereby abruptly enlarging the contact face. Due to this measure, the apex will not contact the underlying substrate and, thus, will not be subjected to wear.

According to the third embodiment, a still further approach of the present invention to solve the afore-mentioned problem is the use of a double-layer film, wherein the lower layer, i.e. the layer which is formed on the substrate, is made of a material which is harder than the material of the upper layer but softer than the material of the tip. If the tip is penetrating into such a film the further movement of the tip will be stopped at that moment at which the apex of the tip is beginning to penetrate into the surface of the harder lower layer. As the hardness of this lower layer nevertheless is much smaller than that of the tip, wear of the tip can be avoided.

In the afore-mentioned two further approaches of the present invention, i.e. when using a stepped tip or a double-layer film, the structures (recesses) in the film preferably are formed by means of heat treatment, preferably by means of a heater which is integrated in the tip, as mentioned above. Moreover, in all three of the afore-mentioned approaches of the invention, the additional application of a predetermined force which is acting substantially perpendicularly to the thin film may be useful.

A combination of the thin-film approach with the stepped-tip approach and/or the double-layer film approach may be useful as well.

The tip used in the present invention, in general, is similiar to those tips which are used in AFM devices, i.e. this tip is movable relative to the surface of the thin film and preferably mounted on a cantilever; the tip preferably being made of silicon.

The thin film preferably consists of a material which should be either deformable by a heat treatment through the tip or deformable by the force applied through the tip. Further, the material of the film should be of such a consistency that it can be formed as a homogenous, smooth and thin film. A suitable material having such properties is e.g. a polymer such as PMMA. A thin metal film having a low melting temperature could be used as well.

By the afore-mentioned advantageous measures of the present invention, no significant wear of the tip is caused, neither by deforming the film by a heat treatment nor by deforming the film by a mechanical penetration of the (heated) tip. Additionally, according to the present invention, no (electro-) chemical processes are involved so that wear of the tip by a chemical reaction can be avoided, too.

Another advantage of the afore-mentioned methods has to be seen in that the penetration depth of the tip can be controlled relatively precise which results in an exact control of the pit or recess size; thus, very fine (nano) structures can be formed. Furthermore, the respective width of the recesses of the structure can be controlled as well.

Another aspect of the invention relates to a method of forming a lithographic pattern by using the afore-mentioned structure forming methods according to the present invention. This lithographic method, according to the fourth embodiment, in total comprises three steps and allows to produce a lithographic pattern which serves as a process mask for a subsequent process step such as plasma etching in which the final structure of the nano-sized device is formed. In other words, the novel nano-structure forming methods of the present invention are used to form a nano-sized mask, i.e. a mask having nanostructures, which serves as process mask for a final production step. The final product, e.g., could be a stamp for producing a plurality of other products by printing or imprinting methods. As the nano-structure forming methods of the present invention are very fast and accurate, the nano-sized devices (such as micro chips, micro machines etc.) can be produced very fast and with a high precision as well.

BRIEF DESCRIPTION OF THE DRAWINGS

In the following, some embodiments of the present invention are described in detail with reference to the accompanying drawings by way of example. In the drawings:

FIGS. 3a and 3b illustrate two different embodiments of a tip which is shaped in accordance with the principles of the present invention;

FIG. 4 illustrates another embodiment in which the penetration depth is limited by the usage of a double-layer film.

DETAILED DESCRIPTION OF THE INVENTION

Figure 1:
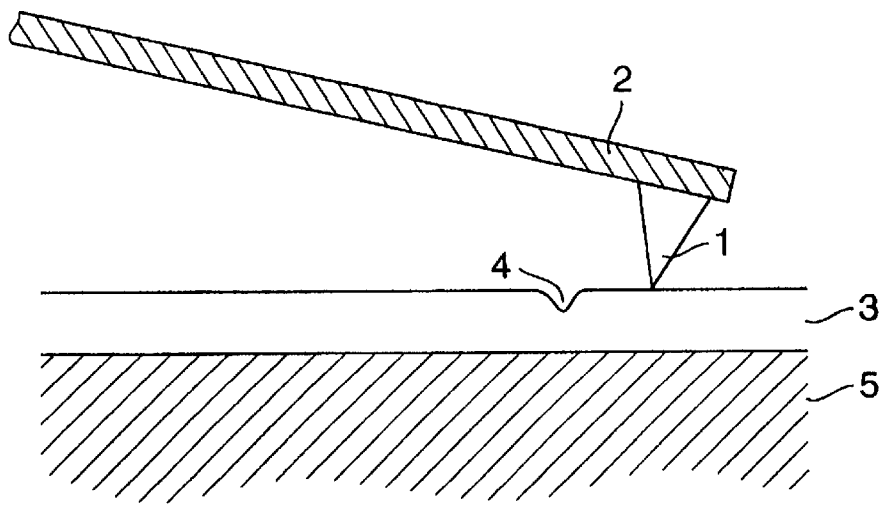
FIG. 1 illustrates a heat writing device and a thin film according to the present invention.

In the following detailed description and in the figures of the drawing, similar or identical elements are identified with the same reference numbers.

Referring now to FIG. 1, there is shown a cantilever 2 having a tip 1 which is similar to those which are used in conventional AFM devices. Thus, the cantilever 2 comprises a (not shown) positioning means for positioning the cantilever 2 and thereby the tip 1 relatively to the surface of the film; in contrast to the positioning means as used in conventional AFM devices, the positioning means of the present invention, in addition, comprises a mode for performing a rough positioning in which comparatively great distances of movement can be realized, thereby enabling the production of huge (nano-) structures.

The tip 1 is heatable by means of an integrated heater (not shown) which is able to heat substantially only the tip 1, i.e. which more or less avoids to heat the neighbouring parts of the cantilever 2. As can be seen from FIG. 1, the shape of the tip 1 basically corresponds to a cone so that the apex of the tip 1 is ending at a very sharp point. The tip 1 is mounted at the free end of the cantilever 2 and is therefore moveable with respect to the surface which is to be treated. This surface belongs to a layer formed on a substrate 5 as a plain, homogeneous and very thin film 3. The film 3 is made of a material which is deformable by heat treatment by means of the tip 1. In this embodiment a PMMA film having a thickness of about 30 nm is used. The film 3, however, also could be made of other suitable polymer materials or of a metal film which has a low melting temperature and which is softer than the material of the tip 1. The substrate 5 is made of a material which has a higher heat conductance than the film 3. With this arrangement, a heat writing can be performed.

During heat writing, the tip 1 may be operated in contact mode or in non-contact mode (i.e., the tip is either touching or not touching the surface of the film during its operation); this operation is similiar to the operation of the tip in an AFM device.

In order to form structures, i.e. dots, lines or other recesses in the surface of the film 3, the tip 1 has to be heated to a temperature which is sufficient to deform the film 3. In FIG. 1 there is further shown a deformation in the form of a dot 4 which has been formed in the film 3 by heat writing. In the non-contact write mode, since the thickness of the film 3 is very small (about 30 nm) and the substrate 5 underneath the film 3 comprises a higher heat conductance, the heat is removed from the film 3 in the direction of the substrate 5; as the respective dimensions of the film 3 and the substrate 5 and the relative heat conductance thereof are known in advance, the size of the respective deformation can be controlled relatively precisely; in the contact write mode, the depth of each deformation will be slightly increased due to the gravitational force applied to the cantilever.

Figure 2:
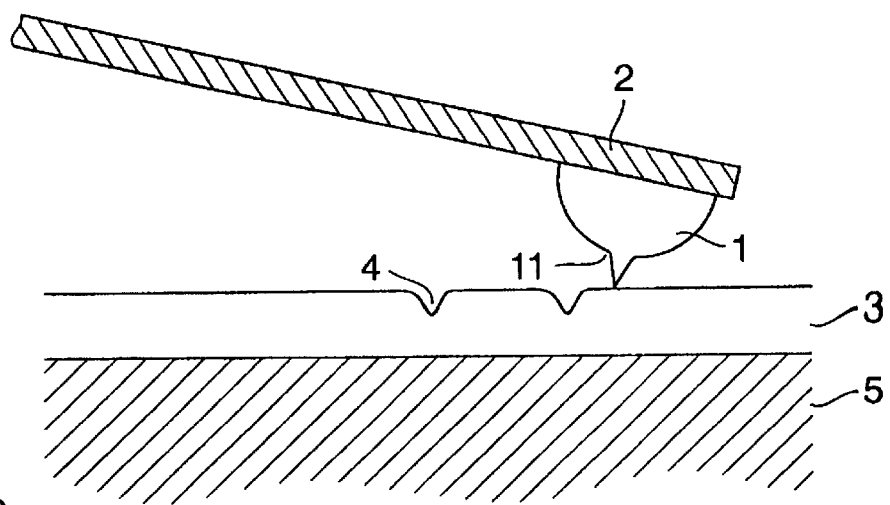
FIG. 2 illustrates a further embodiment according to the present invention in which the tip has a step in order to limit its penetration depth.

Referring to FIG. 2, there is shown a cantilever 2 and a tip 1 similar to that of FIG. 1. In contrast to the embodiment of FIG. 1, the tip 1 is formed with a step 11. It has to be noted that the thickness of the film 3 is not necessarily as thin as in the embodiment of FIG. 1. With this arrangement, the tip 1 preferably is operated in contact mode.

In the embodiment of FIG. 2, the tip 1 preferably comprises an integrated heater which, similarly to the heater of the first embodiment, is able to heat the tip 1 to a temperature which is sufficient to deform the film 3. Additionally to this heating or alternatively to that measure, the tip 1 may be subjected to a predetermined force which is acting substantially perpendicular to the thin film 3 so as to press the tip 1 into the thin film 3 until the step 11 is touching the surface of the thin film 3. It is, however, to be noted that the exclusive usage of force for forming the recesses will have the disadvantage that the tip 1 is more likely to be subjected to wear and, which is even more disadvantageous, will reduce the working speed of the device. Thus, the usage of an integrated heater is the most preferred measure for reducing wear and for increasing the work speed in this embodiment as well.

Accordingly, in order to form structures, i.e. dots, lines or other recesses in the surface of the film 3, the tip 1 is heated and/or a predetermined force is exerted to the cantilever 2 and hence to the tip 1. Thus, the apex of the tip 1 is penetrating into the surface of the thin film 3. As soon as the step 11 of the tip 1 touches the surface of the film 3, the further penetration of the tip 1 is stopped due to the increased surface of the tip which results in an increased resistance against a further deformation of the film 3. Therefor, the penetration depth is controlled by the location of the step 11 of the tip 1.

In FIGS. 3a and 3b, two possible shapes of the tip are depicted by example. These figures should make clear that the terns "step" or "stepped" have to be understood as the area where the inclination of the tip surface against the plane of the film surface is changing from mainly perpendicular, i.e., very steep, to mainly parallel, i.e., very flat. In the transition area of the two inclination extremes, a sort of edge or step is formed. This sudden transition from a steep or sharp tip to a flat or broadened tip results in a sudden increase of the penetration resistance which causes the tip 1 to stop its penetrating movement immediately then when the step 11 reaches the surface of the film 3. The distance from the apex of the tip 1 to the area of an increased penetraton resistance, i.e. the location of the step 11, determines the penetration depth of the tip 1 and therefore the depth of the recess formed in the surface of the film 3.

FIG. 3a shows a tip 1 having a shape in which the step, in a certain distance from the edge, is bent in a curve so as to again obtain a perpendicular inclination. In FIG. 3b, the apex of the tip 1 is formed on a flat base or platform. It should, of course, be clear to those skilled in the art that, for the purposes of the present invention, all those tips 1 can be used which comprise an area of an increased penetration resistance at a certain distance from the apex of the tip 1.

Next, a third embodiment of the invention will be described with reference to FIG. 4; the structure-forming method of this embodiment also uses a cantilever 2 and a tip 1 which is similar to that of FIG. 1. In contrast to the preceding embodiments the film 3 is formed as a double-layer film; the lower layer 3b, i.e. the layer which is formed on the substrate 5, is made of a material which is harder than the material of the upper layer 3a but which is softer than the material of the tip 1. Therefore, if the tip 1 is penetrating into this double-layer film 3, the further movement of the tip 1 towards the film 3 will be stopped at that moment at which the apex of the tip 1 is beginning to penetrate into the surface of the harder lower layer 3b. As the hardness of this lower layer 3b, nevertheless, is much smaller than that of the tip 1, wear of the tip 1 can be avoided.

The upper layer 3a of the thin film 3 is made of PMMA and the lower layer 3b is made of cross-linked PMMA. However, the two layers of the film 3 also could be made of other suitable polymer materials or of a two-layer metal film which has a low melting temperature and which is softer than the material of the tip 1; of course, the respective hardness of these other materials has to be selected such that the lower layer 3b is harder than the upper layer 3a.

In the embodiment of FIG. 3, too, the tip 1 preferably comprises an integrated heater which is able to heat the tip 1 to a temperature which is sufficient to deform the (upper layer 3a of) film 3. Additionally to this heating or alternatively to that measure, the tip 1 may be subjected to a predetermined force which is acting substantially perpendicular to the upper layer 3a so as to press the tip 1 into the upper layer 3a until the apex of the tip 1 is touching the surface of the lower layer 3b.

The afore-mentioned described embodiments of the invention may be suitably modified; furthermore, the different features of these embodiments may be combined, if necessary.

Figure 5A:
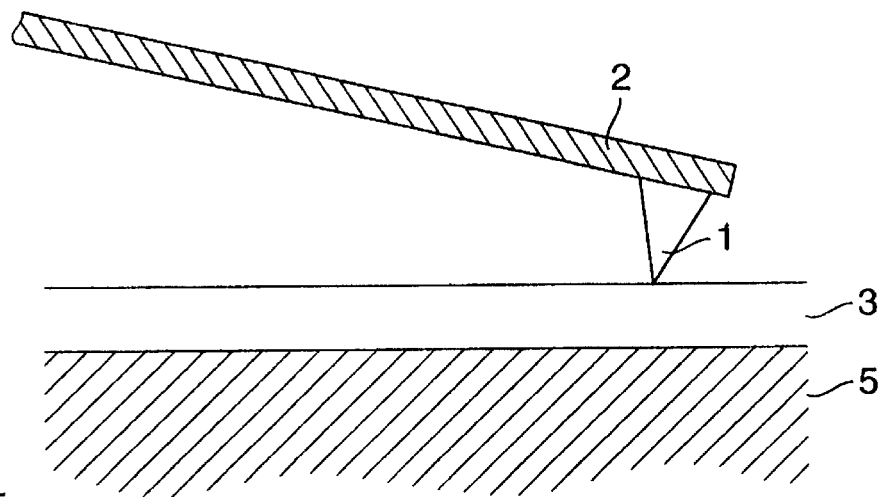
FIGS. 5a, 5b, and 5c illustrate the three subsequently performed steps of a method for forming a lithographic pattern according to the invention.
Figure 5B:
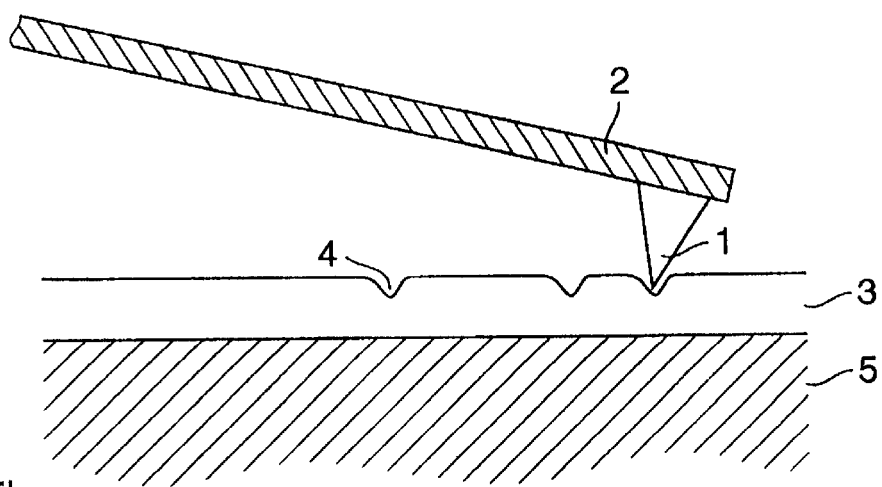
Figure 5C:
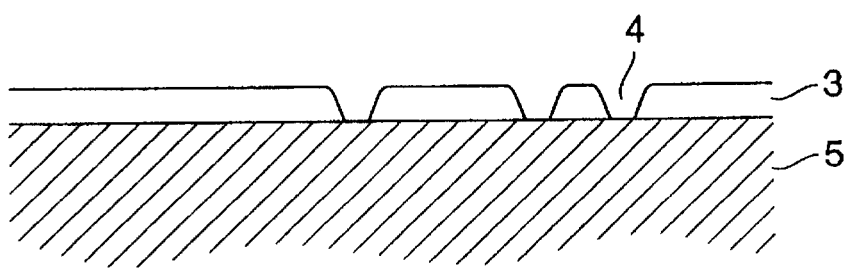

Referring now to FIGS. 5a, 5b and 5c, there are shown three subsequent steps of a method for forming a lithographic pattern on a substrate, this pattern serving as a mask for further processing the substrate.

This method comprises three major steps.

In FIG. 5a, a first step is shown wherein a very thin film 3 (about 30 nm thick) is deposited on a substrate 5 which has a higher heat conductance than the film 3. The respective material used for the film 3 has to be deformable by heat if it is to be subjected to a heat treatment by the heatable tip 1 and should form a homogenous layer on the substrate. In this embodiment, the thin film 3 is preferably made of a polymer such as PMMA.

In FIG. 5b, a second step is shown wherein structures are formed in the film 3 by heat and/or force writing as described above. Thereby, dots or recesses 4 are formed in the film 3. Due to the appropriate control of the penetration depth by the principles of the present invention, the bottom of the formed recesses 4 still represents a covering layer on the substrate, i.e. the recesses are not completely penetrating to the substrate surface. As already mentioned, by this measure wear of the tip 1 can be prevented. The penetration depth control is performed either by a very thin layer in case of heat writing or by a specially shaped tip i.e., by a stepped tip in case of a force writing.

A third step (see FIG. 5c) reduces the thickness of the thin layer 3 to such an extent that the covering layer is removed and a pattern for a further lithographic process remains. When the covering layer is removed, that is, when the recesses 4 are penetrating completely to the substrate surface, the film 3 and the recesses 4 are forming a resist mask having structures with a size in the order of nanometers. The reduction of the film thickness can be achieved by any suitable processing method as e.g. by a plasma etching process.

In each of the afore-described embodiments of the invention a plurality of tips can be used in parallel in order to increase the processing speed. This plurality of tips, preferably, is arranged in form of a matrix, each tip being supported by its own cantilever. As the use of a tip which is exclusively heated—as described hereinabove—has the additional advantage of a very low energy consumption and therefore of a very small power dissipation, the overall power dissipation of a comparatively huge number of parallely used tips is no problem, as experiments made by applicants could prove.

An apparatus for carrying out the method according to the invention comprises at least the movable tip (1) and heating means for heating the tip (1) to a temperature which is sufficient to locally deform that region of the thin film (3) when it is below the tip (1). The heating means may be integrated in the tip (1) or in the cantilever (2) holding the tip (1) so that substantially the tip (1) only is heated. Alternatively or additionally, the tip (1), in the vicinity of the apex thereof, is broadening so as to form a step (11) which is limiting the penetration depth of the tip (1) into the thin film (3). The apparatus may also, alternatively or additionally, comprise means for subjecting the tip (1) to a predetermined force acting substantially perpendicular to the thin film (3) so as to press the tip (1) into the thin film (3). Generally, the apparatus may be built such as to be able to carry out any step of the described method.

With respect to further aspects and advantages of the invention, reference is explicitly made to the disclosure of the drawings.

What is claimed is:

1. Method of forming ultrasmall structures in a thin film provided on a substrate by means of a tip which is movable relative to the surface of said thin film, characterized in that said tip is heated to a temperature which is sufficient to locally deform that region of said thin film which is presently below said tip, said tip penetrating only partway through said thin film, and wherein said tip, in the close vicinity of the apex thereof, is broadening so as to form a step which is limiting the penetration depth of said tip into said thin film.

2. Method according to claim 1, characterized in that said tip is heated by means of an integrated heater so as to heat substantially said tip only.

3. Method according to claim 1, characterized in that said tip is subjected to a force acting substantially perpendicular to said thin film so as to press said tip into said thin film.

4. Method according to claim 1, characterized in that said ultrasmall structures are nanostructures and said tip is mounted on a cantilever.

5. Method of forming ultrasmall structures in a thin film provided on a substrate by means of a tip which is movable relative to the surface of said thin film, characterized in that said tip, near the distal end thereof, is broadening so as to form a step which is limiting the penetration depth of said tip into said thin film.

6. Method according to claim 5, characterized in that said tip is heated to a temperature which is sufficient to locally deform that region of said thin film which is presently below said tip.

7. Method according to claim 5, characterized in that said tip is subjected to a force acting substantially perpendicular to said thin film so as to press said tip into said thin film until said step is touching the surface of said thin film.

8. Method of forming ultrasmall (nano) structures in a thin film provided on a substrate by means of a tip which is movable relative to the surface of said thin film, characterized in that said thin film is a double-layer film, the lower layer—which is formed on said substrate—being made of a material which is harder than the material of the upper layer but softer than the material of said tip.

9. Method according to claim 8, characterized in that said tip is heated to a temperature which is sufficient to locally deform that region of the upper layer of said thin film which is presently below said tip, said tip penetrating only partway through said upper layer of said thin film.

10. Method according to claim 9, characterized in that said tip is heated by means of an integrated heater so as to heat substantially said tip only.

11. Method according to claim 8, characterized in that said tip, in the close vicinity of the apex thereof, is broadening so as to form a step which is limiting the penetration depth of said tip into said thin film.

12. Method according to claim 8, characterized in that said tip is subjected to a force acting substantially perpendicular to said thin film so as to press said tip into the upper layer of said thin film.

13. Apparatus for forming ultrasmall structures in a thin film on a substrate, comprising a movable tip and heating means for heating said tip to a temperature to locally deform that region of said thin film when it is below said tip, said tip penetrating only partway through said thin film, and wherein said tip, in the vicinity of the apex thereof, is broadening so as to form a step which is limiting the penetration depth of said tip into said thin film.

14. Apparatus according to claim 13, characterized in that said heating means is integrated in said tip or in a cantilever holding said tip so that substantially said tip only is heated.

15. Apparatus according to claim 13, characterized in that said apparatus comprises means for subjecting said tip to a force acting substantially perpendicular to said thin film so as to press said tip into said thin film.

* * * * *